(12) United States Patent
Nomura et al.

(10) Patent No.: US 11,282,797 B2
(45) Date of Patent: Mar. 22, 2022

(54) MANUFACTURING METHOD OF HIGH FREQUENCY MODULE AND HIGH FREQUENCY MODULE HAVING GROOVE IN SEALING RESIN LAYER

(71) Applicant: Murata Manufacturing Co., Ltd., Kyoto (JP)

(72) Inventors: Tadashi Nomura, Kyoto (JP); Toru Komatsu, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/083,506

(22) Filed: Oct. 29, 2020

(65) Prior Publication Data

US 2021/0043583 A1 Feb. 11, 2021

Related U.S. Application Data

(63) Continuation of application No. PCT/JP2019/018206, filed on May 7, 2019.

(30) Foreign Application Priority Data

May 8, 2018 (JP) .............................. JP2018-089684

(51) Int. Cl.
*H01L 23/552* (2006.01)
*H01L 21/56* (2006.01)
(Continued)

(52) U.S. Cl.
CPC ............ *H01L 23/552* (2013.01); *H01L 21/56* (2013.01); *H01L 23/3142* (2013.01); *H01L 23/66* (2013.01)

(58) Field of Classification Search
CPC ..... H01L 23/552; H01L 21/56; H01L 21/565; H01L 23/3142; H01L 23/315; H01L 23/3157
(Continued)

(56) References Cited

U.S. PATENT DOCUMENTS

2011/0013349 A1* 1/2011 Mori ....................... H01L 23/66
361/679.02
2015/0043170 A1 2/2015 Shimamura et al.
(Continued)

FOREIGN PATENT DOCUMENTS

JP 2001244688 A 9/2001
JP 5576542 B1 8/2014
(Continued)

OTHER PUBLICATIONS

International Search Report issued in Application No. PCT/JP2019/018206, dated Jul. 23, 2019.
(Continued)

*Primary Examiner* — Didarul A Mazumder
(74) *Attorney, Agent, or Firm* — Pearne & Gordon LLP

(57) ABSTRACT

A high frequency module having a groove for shielding formed in a sealing resin layer achieves downsizing without damaging wiring electrodes formed on a wiring board or mounting components. A manufacturing method of a high frequency module includes mounting components on an upper surface of a wiring board, and then forming a sacrificial layer for forming a groove. The method further
(Continued)

includes forming a sealing resin layer for sealing the components and the sacrificial layer, and dissolving and removing the sacrificial layer to form the groove for shielding. Finally, the method includes forming a shield film coating the surface of the sealing resin layer, and the high frequency module is manufactured. With this method, even when the groove is formed at a position overlapping with the component or a surface layer wiring electrode, the high frequency module can be downsized without damaging the component or the surface layer wiring electrode.

20 Claims, 6 Drawing Sheets

(51) Int. Cl.
*H01L 23/31* (2006.01)
*H01L 23/66* (2006.01)

(58) Field of Classification Search
USPC .................................................. 257/659, 660
See application file for complete search history.

(56) References Cited

U.S. PATENT DOCUMENTS

| 2015/0043171 | A1* | 2/2015 | Mugiya | H01L 24/97 |
| | | | | 361/728 |
| 2015/0043172 | A1* | 2/2015 | Mugiya | H05K 3/284 |
| | | | | 361/728 |
| 2015/0119102 | A1 | 4/2015 | Saji et al. | |
| 2018/0092257 | A1 | 3/2018 | Ostubo et al. | |
| 2020/0058599 | A1 | 2/2020 | Okada et al. | |

FOREIGN PATENT DOCUMENTS

| JP | 2015053298 A | 3/2015 |
| JP | 2015057803 A | 3/2015 |
| JP | 2015111747 A | 6/2015 |
| WO | 2009122835 A1 | 10/2009 |
| WO | 2016181954 A1 | 11/2016 |
| WO | 2018198856 A1 | 11/2018 |

OTHER PUBLICATIONS

Written Opinion issued in Application No. PCT/JP2019/018206, dated Jul. 23, 2019.

* cited by examiner

FIG. 1
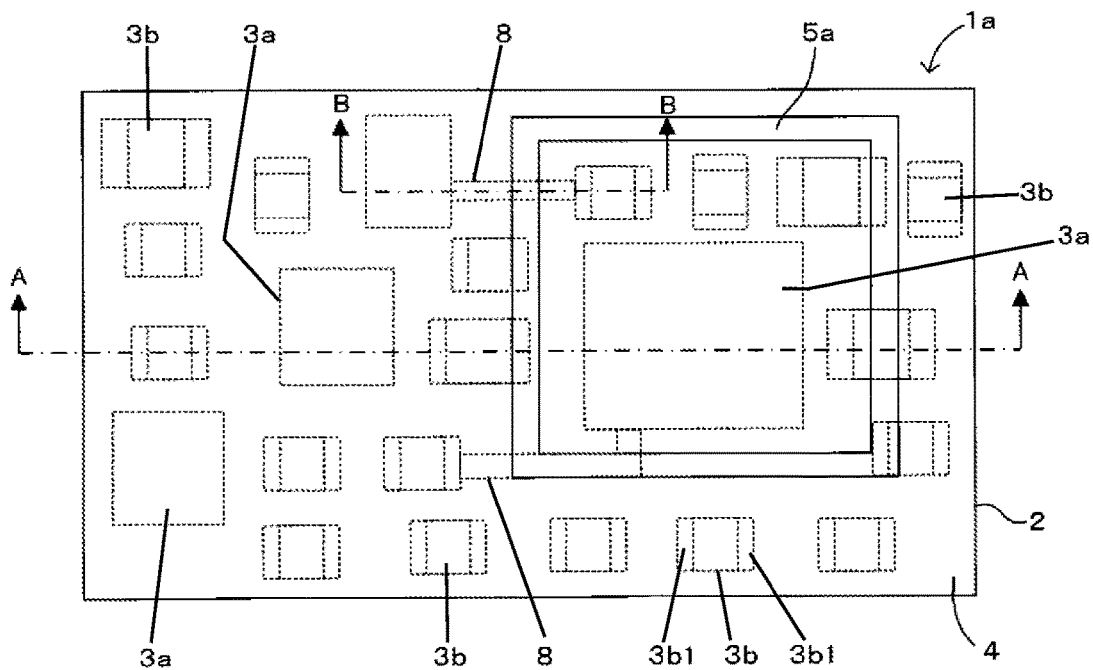
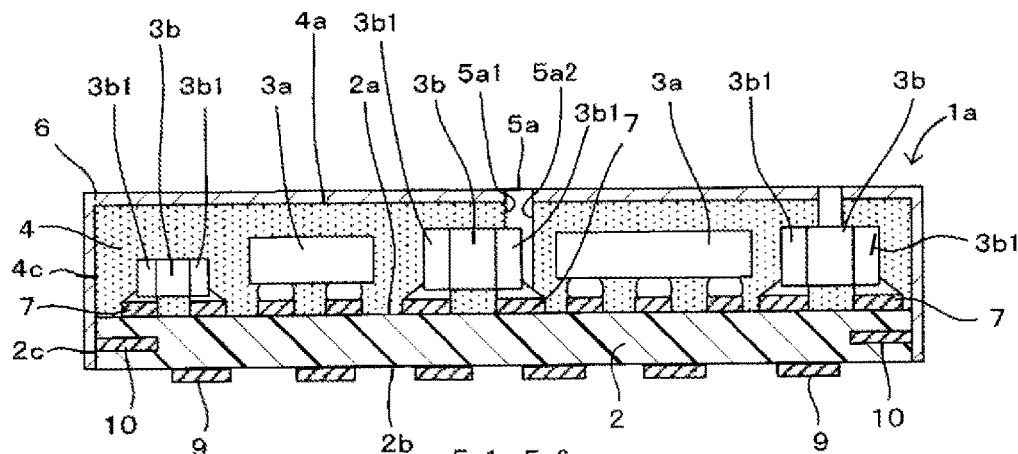
FIG. 2A
FIG. 2B
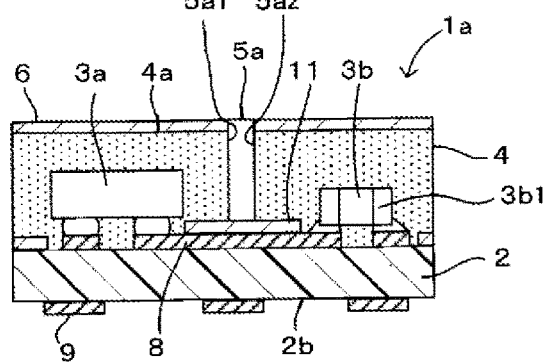

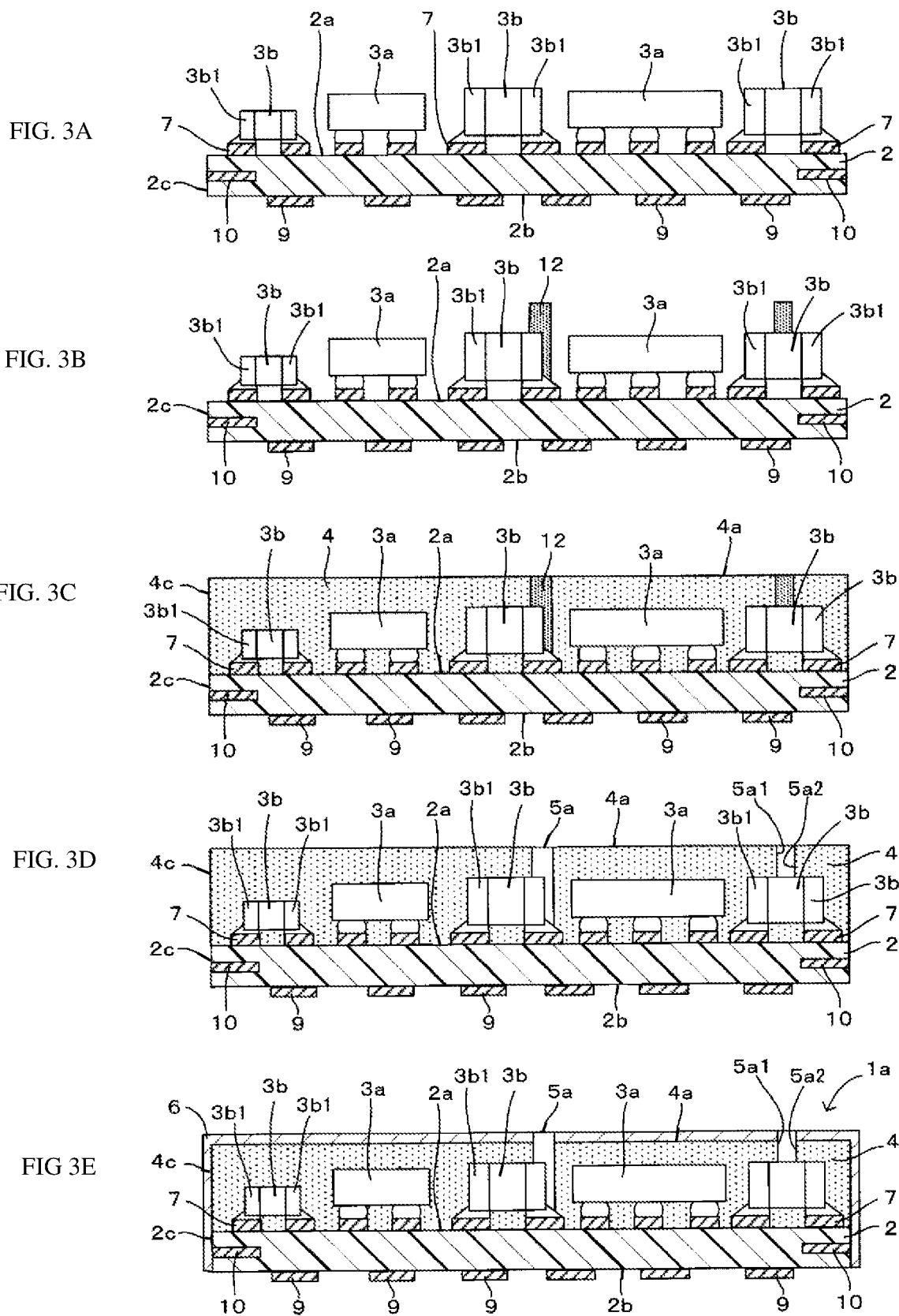

MANUFACTURING METHOD OF HIGH FREQUENCY MODULE AND HIGH FREQUENCY MODULE HAVING GROOVE IN SEALING RESIN LAYER

CROSS REFERENCE TO RELATED APPLICATION

This is a continuation of International Application No. PCT/JP2019/018206 filed on May 7, 2019 which claims priority from Japanese Patent Application No. 2018-089684 filed on May 8, 2018. The contents of these applications are incorporated herein by reference in their entireties.

BACKGROUND OF THE DISCLOSURE

Field of the Disclosure

The present disclosure relates to a high frequency module having a groove for shielding formed in a sealing resin layer and a manufacturing method thereof.

Description of the Related Art

A high frequency module mounted on a mobile terminal device and the like may be provided with a shield layer for shielding electromagnetic waves. In some high frequency modules of this type, there are ones in which components mounted on a wiring board are coated with a resin layer, and a shield layer is provided so as to coat the surface of the resin layer.

The shield layer as such is provided to shield noise from the outside, but when a plurality of components are mounted on the wiring board, noise generated from these components sometimes interferes with other components. Therefore, conventionally, a shield wall is sometimes provided not only to shield the noise from the outside but also to suppress interference of the noise between the mounting components. For example, as shown in FIG. 9, in a high frequency module 100 described in Patent Document 1, a plurality of components 102a, 102b are mounted on an upper surface 101a of a wiring board 101, and the components 102a, 102b are sealed with a sealing resin layer 103. Further, a trench 104 is formed in the sealing resin layer 103 between the two components 102a, 102b. Then, when the surface of the sealing resin layer 103 is coated with a conductive material, the trench 104 is also filled with the conductive material to form an outer shield part 105 that functions as a shield for the entire component and an inner shield part 106 that functions as a shield between the components.

In this high frequency module 100, the sealing resin layer 103 is laser-processed to form the trench 104, and the trench 104 is filled with a conductive resin to form the inner shield part 106. The shield is in contact with a surface layer conductor 107 connected to a ground potential.

Patent Document 1: Japanese Patent No. 5576542 B1 (refer to paragraphs 0022 to 0060, FIG. 4, etc.)

BRIEF SUMMARY OF THE DISCLOSURE

In Patent Document 1, the surface layer conductor 107 is formed on the upper surface 101a of the wiring board 101 corresponding to the trench 104. Because the surface layer conductor 107 reflects a laser beam, the presence of the surface layer conductor can reduce damage to the wiring board 101 caused by the laser beam when the trench 104 is formed. However, although the damage is reduced, the conventional high frequency module 100 does not eliminate damage to the surface layer conductor 107 caused by the laser beam during laser processing, and therefore, the surface layer conductor 107 cannot be used as a signal wiring electrode. Therefore, the signal wiring electrode needs to be formed in a region of the upper surface 101a of the wiring board 101 other than the portion corresponding to the trench 104, or in an inner layer of the wiring board 101, and in this case, the size of the high frequency module 100 becomes large. Further, when the trench 104 is formed on the signal wiring electrode, the trench 104 may be formed to have a depth that does not reach the wiring electrode, but in this case, the sealing resin layer partially remains and this hinders the high frequency module 100 from being reduced in height. Further, also when the trench 104 is formed between the component 102a and the component 102b, the trench 104 needs to be separated from the components 102a, 102b to the extent that the components are not affected by the laser beam, and this also hinders the high frequency module 100 from being downsized. Further, for example, even when the trench 104 is formed above the components 102a, 102b, because there is a risk of damaging the components 102a, 102b, the trench 104 needs to be formed while being separated from the components 102a, 102b, the sealing resin layer partially remains, and this also hinders the high frequency module 100 from being reduced in height.

The present disclosure has been made in view of the above-mentioned problems, and it is an object of the present disclosure to achieve downsizing of a high frequency module in which a groove for shielding is formed in a sealing resin layer, without damaging a wiring electrode or mounting components formed on a wiring board.

In order to achieve the above-mentioned object, there is provided according to the present disclosure, a manufacturing method of a high frequency module including a sealing resin layer, the method including: a mounting step of mounting a component on a main surface of a wiring board; a sacrificial layer forming step of forming a sacrificial layer to form, on the main surface of the wiring board, a groove on the sealing resin layer; a sealing resin layer forming step of forming the sealing resin layer that seals the sacrificial layer together with the component; a removal step of removing the sacrificial layer; and a shield film forming step of forming a shield film that coats a surface of the sealing resin layer. The sacrificial layer is formed of a resin different from a resin of the sealing resin layer, and in the removal step, the groove is formed by dissolving and removing the resin of the sacrificial layer.

Further, in the sacrificial layer forming step, the groove may be formed on a signal wiring electrode by forming the sacrificial layer such that the sacrificial layer at least partially overlaps with the signal wiring electrode formed on the main surface of the wiring board when viewed from a direction perpendicular to the main surface of the wiring board.

Further, before the sacrificial layer forming step, a step of forming a coating insulating layer that coats at least the signal wiring electrode may be further provided.

Further, in the sacrificial layer forming step, the groove may be formed on the component by forming the sacrificial layer such that the sacrificial layer at least partially overlaps with the component when viewed from the direction perpendicular to the main surface of the wiring board.

Further, in the sacrificial layer forming step, the sacrificial layer may be formed such that a sectional area of the sacrificial layer in a direction parallel to the main surface of the wiring board increases as the sacrificial layer separates from the main surface of the wiring board.

Further, in the sacrificial layer forming step, the sacrificial layer may be formed such that the sectional area of the sacrificial layer in the direction parallel to the main surface of the wiring board becomes smaller as the sacrificial layer separates from the main surface of the wiring board.

A high frequency module according to the present disclosure includes: a wiring board; a component formed on one main surface of the wiring board; a sealing resin layer that seals the component; a groove formed in the sealing resin layer; and a shield film that coats at least a surface of the sealing resin layer. The groove at least partially overlaps with the component when viewed from a direction perpendicular to the one main surface of the wiring board, and the component is partially exposed from a bottom of the groove at the overlapping position.

Further, the component may have a ground electrode formed at a portion exposed from the bottom of the groove, and the shield film may be electrically connected to the ground electrode.

Further, the groove may have one inner wall surface and the other inner wall surface facing the one inner wall surface, and at least the one inner wall surface may be inclined such that a lower end edge is positioned further in a direction opposite to an inward direction of the groove than an upper end edge, when viewed from a direction perpendicular to the one main surface of the wiring board, and the one inner wall surface may not be coated with the shield film.

Another high frequency module of the present disclosure includes: a wiring board; a component formed on one main surface of the wiring board; a sealing resin layer that seals the component; a groove formed in the sealing resin layer; and a shield film that at least coats a surface of the sealing resin layer. The groove is formed so as to divide the sealing resin layer in a plurality of regions when viewed from a direction perpendicular to the one main surface of the wiring board, and formed so as to partially overlap with a signal wiring electrode formed on the one main surface of the wiring board. Further, by the signal wiring electrode being coated with the coating insulating layer, the coating insulating layer is exposed from a bottom of the groove at a position overlapping with the groove of the signal wiring electrode, and the groove has a wall surface not coated with the shield film.

Further, the wiring board may have another component different from the component mounted on the other main surface.

According to the present disclosure, because the groove for shielding is formed by dissolving and removing the sacrificial layer, the groove is not necessarily separated from the component, unlike in the conventional high frequency module. Further, for example, even when the groove is formed on the component, the component is not damaged by the laser beam and the like. Further, even when the groove is formed on the wiring electrode on the one main surface of the wiring board, there is no risk of the wiring electrode being damaged. Therefore, in the high frequency module in which the groove for shielding is formed in the sealing resin layer, the downsizing can be achieved without damaging the components or the wiring electrodes.

BRIEF DESCRIPTION OF THE SEVERAL VIEWS OF DRAWINGS

FIG. 1 is a plan view of a high frequency module according to a first embodiment of the present disclosure with a shield film removed.

FIGS. 2A and 2B are sectional views of FIG. 1, where FIG. 2A is the sectional view taken along line A-A and FIG. 2B is the sectional view taken along line B-B.

FIGS. 3A to 3E are views for explaining a manufacturing method of the high frequency module in FIG. 1.

DETAILED DESCRIPTION OF THE DISCLOSURE

First Embodiment

Figure 4A:
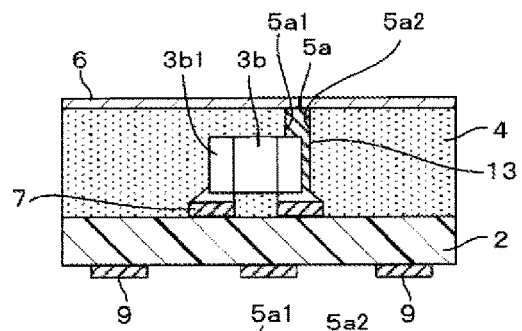
FIGS. 4A to 4F are views showing a modification of a shield structure of FIG. 1.

A high frequency module 1a according to a first embodiment of the present disclosure is described with reference to FIGS. 1, 2A and 2B. Note that FIG. 1 is a plan view of the high frequency module 1a with a shield film 6 removed, and FIGS. 2A and 2B are sectional views of the high frequency module 1a, in which FIG. 2A is the sectional view taken along line A-A of FIG. 1, and FIG. 2B is the sectional view taken along line B-B of FIG. 1.

As shown in FIGS. 1, 2A and 2B, the high frequency module 1a according to this embodiment includes a wiring board 2, a plurality of components 3a, 3b mounted on an upper surface 2a of the wiring board 2, a sealing resin layer 4 laminated on the upper surface 2a of the wiring board 2, a shield film 6 coating a surface of the sealing resin layer 4, and a groove 5a provided in the sealing resin layer 4, and, for example, is mounted on a mother board of an electronic instrument and the like that uses a high frequency signal.

The wiring board 2 is made of, for example, low-temperature co-fired ceramic or glass epoxy resin. Then, on the upper surface 2a of the wiring board 2 (corresponding to "the main surface of the wiring board" of the present disclosure), there are formed mounting electrodes 7 for mounting respective components 3a, 3b, a surface layer wiring electrode 8 for signal transmission, and others. Further, a plurality of external electrodes 9 for external connection are formed on a lower surface 2b of the wiring board 2. Further, in this embodiment, the wiring board 2 has a multilayer structure formed by laminating a plurality of insulating layers, and various internal wiring electrodes 10 are formed in each of adjacent insulating layers. Further, inside the wiring board 2, a plurality of via conductors (not shown) are formed for connecting the internal wiring electrodes 10 formed in different insulating layers. In addition, among the internal wiring electrodes 10, one that functions as a ground electrode is partially exposed at an end from a side surface 2c of the wiring board 2, and is connected to the shield film 6 at the exposed portion. As a result, the shield film 6 is grounded.

In addition, a predetermined region on the upper surface 2a of the wiring board 2, excluding regions of forming the respective mounting electrodes 7, is coated with a coating insulating layer 11 (see FIG. 2B). This predetermined region includes a region of forming the surface layer wiring electrode 8 for signal transmission. That is, the surface layer wiring electrode 8 is coated with the coating insulating layer 11, and when viewed from a direction perpendicular to the upper surface 2a of the wiring board 2, a portion overlapping with the groove 5a has the coating insulating layer 11 exposed from the bottom of the groove 5a. The coating insulating layer 11 can be formed of insulating material such as epoxy resin, solder resist, or liquid crystal polymer (LCP). Further, when the surface layer wiring electrode 8 having a portion overlapping with the groove 5a is a wiring electrode for grounding, the surface layer wiring electrode 8 may not be coated with the coating insulating layer 11. In this case, inner wall surfaces 5a1, 5a2 of the groove 5a and the wiring electrode may be coated with the shield film 6 so that the shield film 6 is electrically connected to the wiring electrode.

The mounting electrodes 7, the surface layer wiring electrode 8, the external electrodes 9, and the internal wiring electrodes 10 are all formed of metal, such as Cu, Ag, or Al, which is generally used as a wiring electrode. The via conductor is made of metal such as Ag or Cu. The mounting electrodes 7, the surface layer wiring electrode 8, and the external electrodes 9 may be Ni/Au plated.

Each of the components 3a, 3b is constituted of an active element (the component 3a) such as a semiconductor device, and a passive element (the component 3b) such as a chip inductor, a chip capacitor or a chip resistor. For example, the semiconductor device is formed in a rectangular parallelepiped shape, has solder bumps as external terminals arranged in an array on the active surface, and is mounted on the wiring board 2 by flip-chip mounting. The chip component (a passive element: the component 3b) is, for example, formed in a rectangular parallelepiped shape, has surfaces on both ends in the longitudinal direction coated with metal, and is formed with side surface electrodes 3b1 for external connection. These side surface electrodes 3b1 and predetermined mounting electrodes 7 are connected by using solder and the like. The side surface electrode 3b1 of the component 3b can be formed, for example, in a multilayer structure including a lowermost Cu layer, an intermediate Ni layer, and an outermost Sn layer.

The sealing resin layer 4 coats the upper surface 2a of the wiring board 2 and the components 3a, 3b and is laminated on the upper surface 2a of the wiring board 2. The sealing resin layer 4 can be formed of a resin generally adopted as a sealing resin such as an epoxy resin.

The groove 5a for shielding is formed on an upper surface 4a of the sealing resin layer 4. As shown in FIG. 1, when viewed from a direction perpendicular to the upper surface 4a of the sealing resin layer 4 (a direction perpendicular to the upper surface 2a of the wiring board 2), the groove 5a is formed in a shape of surrounding a predetermined region of the upper surface 4a of the sealing resin layer 4. Therefore, the upper surface 4a of the sealing resin layer 4 is divided into an inner region surrounded by the groove 5a and an outer region other than the inner region.

Further, the groove 5a is formed at a position overlapping with some of the components 3b and the surface layer wiring electrode 8 when viewed from the direction perpendicular to the upper surface 2a of the wiring board 2. Further, the components 3b overlapping with the groove 5a are partially exposed from the bottom of the groove 5a at the overlapping position. Further, as for the surface layer wiring electrode 8, the coating insulating layer 11 that coats the surface layer wiring electrode 8 is exposed from the bottom of the groove 5a at a position overlapping with the groove 5a (see FIG. 2B).

Further, among the components 3b overlapping with the groove 5a, there are ones each of whose side surface electrode 3b1 is exposed from the bottom of the groove 5a, and ones each of whose region on the upper surface of the component 3b between the pair of side surface electrodes 3b1 is exposed from the bottom of the groove 5a (see FIG. 2A). At the location where the side surface electrode 3b1 is exposed, not only the side surface electrode 3b1 of the component 3b, but also the mounting electrode 7 is exposed at a portion to which the side surface electrode 3b1 is soldered to be connected (a connection portion between the side surface electrode 3b1 and the mounting electrode 7). Further, in this embodiment, the groove 5a is formed in a straight shape in which a groove width does not change in the depth direction of the groove 5a, and the inner wall surfaces 5a1, 5a2 of the groove 5a are not coated with the shield film 6. Therefore, in the shield film 6, the inner region and the outer region of the groove 5a are in a state of being electrically separated from each other with the groove 5a as a boundary.

According to the experiments by the inventors, it has been confirmed that even when the inner wall surfaces 5a1, 5a2 of the groove 5a are not coated with the shield film 6, the shielding function between the components is ensured in the inner region and the outer region of the groove 5a. This is considered because the groove 5a creates a resin-free space in the sealing resin layer 4 between the inner region and the outer region, and separating the shield film 6 can prevent the noise from being transmitted through the shield film 6 from one of the inner region and the outer region to the other.

The shield film 6 is provided for shielding external noise from the various internal wiring electrodes 10 in the wiring board 2 and the components 3a, 3b, and coats the upper surface 4a and a side surface 4c of the sealing resin layer 4, and the side surface 2c of the wiring board 2. Further, the shield film 6 can be formed in a multilayer structure having an adhesion film laminated on the surface of the sealing resin layer 4, a conductive film laminated on the adhesion film, and a protective film laminated on the conductive film.

The adhesion film is provided to increase the adhesion strength between the conductive film and the sealing resin layer 4, and can be formed of metal such as stainless steel (SUS). The conductive film is a layer that serves a substantial shield function of the shield film 6, and can be formed of, for example, any metal among Cu, Ag, and Al. The protective film is provided in order to prevent the conductive film from being corroded or scratched, and can be formed of, for example, SUS.

(Manufacturing Method of High Frequency Module 1a)

Next, a manufacturing method of the high frequency module 1a is described with reference to FIGS. 3A to 3E.

First, as shown in FIG. 3A, a wiring board 2 is prepared, on which each of the mounting electrodes 7, the surface layer wiring electrode 8, the external electrodes 9, the internal wiring electrodes 10, and others are formed, and each of the components 3a, 3b is formed on the upper surface 2a of the wiring board 2. The components 3a and 3b are mounted by using a general surface mounting technique such as solder joining using the reflow process.

Next, as shown in FIG. 3B, a sacrificial layer 12 for forming the groove 5a in the sealing resin layer 4 is formed. The sacrificial layer 12 can be formed using a photolithography technique. In this case, the sacrificial layer 12 can use a resist resin. As another forming method, for example, ink is applied by ink-jet printing to the position where the groove 5a is to be formed, and the ink is cured. Further, ink is further laminated on the cured ink by ink-jet printing, and the laminated ink is cured. In this way, the application/curing of ink is repeated to laminate the ink, thereby the sacrificial layer 12 is formed which surrounds the inner region of the groove 5a to be formed later. As the ink used in the ink-jet printing, for example, a water-soluble resin or the like can be used. In addition, at the location where the groove 5a overlaps with the component 3b or the surface layer wiring electrode 8, the sacrificial layer 12 is formed on the coating insulating layer 11 that coats the component 3b or the surface layer wiring electrode 8.

Next, as shown in FIG. 3C, the sealing resin layer 4 that coats each of the components 3a and 3b and the sacrificial layer 12 is formed on the upper surface 2a of the wiring board 2. The sealing resin layer 4 can be formed of, for example, a general sealing resin such as an epoxy resin. As a method of forming the sealing resin layer 4, for example, the dispensing process, the printing process, the compression molding process, or others can be adopted.

When the sacrificial layer 12 surrounds the inner region of the groove 5a as in this embodiment, it is configured that the resin of the sealing resin layer 4 does not easily flow into the inner region. Therefore, for example, the height of the sacrificial layer 12 (the height from the upper surface 2a of the wiring board 2) may be formed to be lower than the components 3a, 3b mounted in the inner region, so that the resin of the sealing resin layer 4 easily flows into the inner region. In this case, after the sealing resin layer 4 is formed, the upper end of the sacrificial layer 12 may be exposed by, for example, laser processing. Further, an inflow port may be formed in the sacrificial layer 12 by partially cutting out the sacrificial layer 12. In this case, the shape and location of the inflow port can be appropriately selected, and may be any shape or location as long as the resin of the sealing resin layer 4 can flow in the inner region.

When the upper end of the sacrificial layer 12 is not exposed from the upper surface 4a of the sealing resin layer 4 when the sealing resin layer 4 is formed, the upper end of the sacrificial layer 12 is exposed. In this case, for example, the upper surface 4a of the sealing resin layer 4 may be polished or ground to expose the upper end of the sacrificial layer 12, or the resin on the sacrificial layer 12 may be removed by laser processing to expose the upper end of the sacrificial layer 12.

Figure 8:
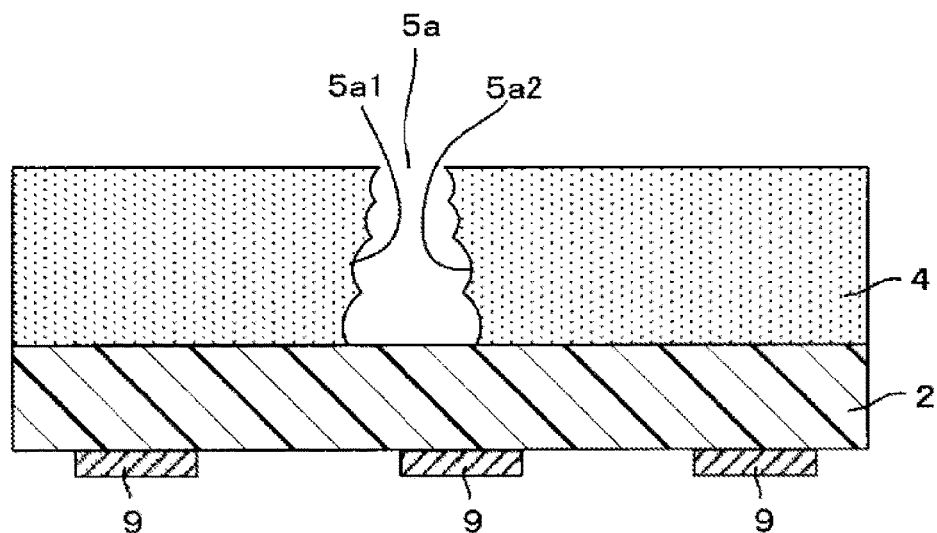
FIG. 8 is a view for explaining a shape of a groove of each embodiment.
Figure 9:
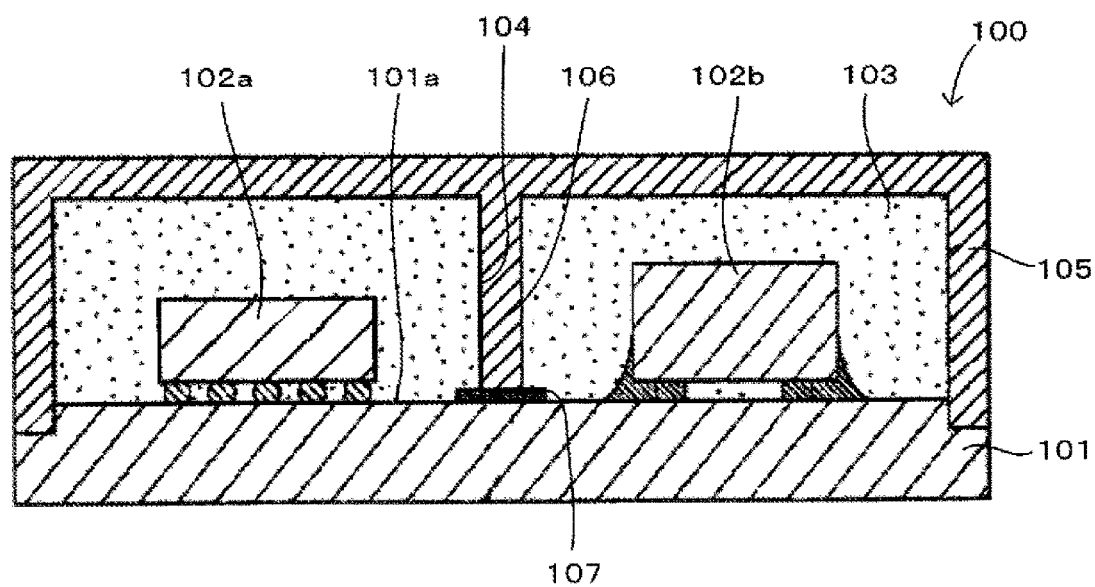
FIG. 9 is a sectional view of a conventional high frequency module.

Next, as shown in FIG. 3D, the sacrificial layer 12 is removed by dissolving or the like to form the groove 5a. For example, in the case of forming the sacrificial layer 12 by photolithography, the sacrificial layer 12 is removed by being immersed in a dissolving solution that dissolves the resist resin forming the sacrificial layer 12 but not the resin of the sealing resin layer 4. In the case where the sacrificial layer 12 is a water-soluble resin, the sacrificial layer 12 is removed by being immersed in pure water. In the case of forming the sacrificial layer 12 by laminating the ink by ink-jet printing, the cross sections of the inner wall surfaces 5a1, 5a2 in a width direction of the groove 5a (cross sections in a direction perpendicular to the upper surface 2a of the wiring board 2) can be formed in a wavy shape as shown in FIG. 8.

Finally, the shield film 6 coating the upper surface 4a and the side surface 4c of the sealing resin layer 4 and the side surface 2c of the wiring board 2 is formed, and the high frequency module 1a is completed. The shield film 6 can be formed by the sputtering method or the vapor deposition method. At this time, the shield film 6 is prevented from coating the inner wall surfaces 5a1, 5a2 of the groove 5a. By doing so, in the shield film 6, a portion that coats the inner region of the groove 5a and a portion that coats the outer region are electrically separated from each other, and the shield characteristics of the groove 5a are improved. When the width of the groove 5a is narrowed, the inner wall surfaces 5a1, 5a2 of the groove 5a are less likely to be coated with the shield film 6, therefore, the width of the groove 5a is adjusted in order to prevent the inner wall surfaces 5a1, 5a2 from being coated with the shield film 6.

Therefore, according to the above-described embodiment, because the groove 5a for shielding is formed by dissolving and removing the sacrificial layer 12, unlike the conventional high frequency module in which the groove is formed by performing laser processing or cutting with a dicing machine, the groove 5a does not need to be separated from the component 3b. That is, even when the groove 5a and the component 3b are brought close to each other until the component 3b is exposed from the bottom of the groove 5a, the component 3b is not damaged, and accordingly, the high frequency module 1a can be downsized and can be reduced in height.

Further, even when the groove 5a is formed directly above the surface layer wiring electrode 8 of the wiring board 2, because the surface layer wiring electrode 8 is not damaged, the surface layer wiring electrode 8 does not need to be laid around so as not to pass directly under the groove 5a as in the conventional case. In this case, the area of the main surface (the upper surface 2a, the lower surface 2b) of the wiring board 2 can be reduced, and the high frequency module 1a can be downsized. Further, because laser processing or cutting with a dicing machine is not performed to form the groove 5a, the wiring board 2 and the internal wiring electrodes 10 are not damaged, and the reliability of the high frequency module 1a is improved.

(Modification of Shield Structure Using Groove 5a)

The shield structure using the groove 5a can be appropriately changed. For example, as shown in FIG. 4A, in the case in which the side surface electrode 3b1 of the component 3b and the mounting electrode 7 soldered to the side surface electrode 3b1 are partially exposed from the bottom of the groove 5a, a conductive member 13 may be arranged by filling the groove 5a with a conductive paste (such as Cu paste or Ag paste) and the conductive member 13 may be connected to the shield film 6. In this case, because the side surface electrode 3b1 of the component 3b is electrically connected to the shield film 6, the side surface electrode 3b1 exposed from the bottom of the groove 5a is the ground electrode of the component 3b. Further, because the shield film 6 can be grounded from the side surface electrode 3b1 of the component 3b, the shield film 6 is not necessarily connected to the internal wiring electrode 10 (the ground electrode) exposed from the side surface 2c of the wiring board 2.

Figure 4B:
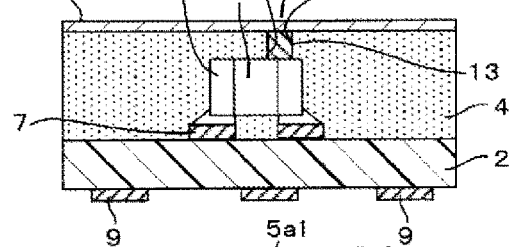

Further, as shown in FIG. 4B, in the case in which, among the upper surface of the component 3b, the portion coated with the side surface electrode 3b1 and the portion not coated therewith are both partially exposed from the bottom of the groove 5a, in other words, in the case in which, among the upper surface of the component 3b, a specific region including a boundary between the portion coated with the one side electrode 3b1 and the portion not coated therewith is exposed from the bottom of the groove 5a, the groove 5a may be filled with the conductive member 13 made of the conductive paste (such as the Cu paste or the Ag paste). In this case, because the side surface electrode 3b1 of the component 3b is electrically connected to the shield film 6, the side surface electrode 3b1 exposed from the bottom of the groove 5a is the ground electrode of the component 3b. Further, because the shield film 6 can be grounded from the side surface electrode 3*b*1 of the component 3*b*, the shield film 6 is not necessarily connected to the internal wiring electrode 10 (the ground electrode) exposed from the side surface 2*c* of the wiring board 2.

Figure 4C:
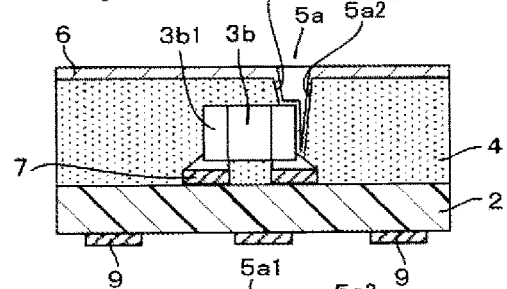

Further, as shown in FIG. 4C, in the case in which the side surface electrode 3*b*1 of the component 3*b* and the mounting electrode 7 soldered to the side surface electrode 3*b*1 are partially exposed from the bottom of the groove 5*a*, the inner wall surfaces 5*a*1, 5*a*2 of the groove 5*a* and a region exposed from the bottom of the groove 5*a* (the side surface electrode 3*b*1 of the component 3*b*, and the connection portion between the side surface electrode 3*b*1 and the mounting electrode 7) may be coated with the shield film 6. Also, in this case, because the side surface electrode 3*b*1 of the component 3*b* is electrically connected to the shield film 6, the side surface electrode 3*b*1 exposed from the bottom of the groove 5*a* is the ground electrode of the component 3*b*. Further, because the shield film 6 can be grounded from the side surface electrode 3*b*1 of the component 3*b*, the shield film 6 is not necessarily connected to the internal wiring electrode 10 (the ground electrode) exposed from the side surface 2*c* of the wiring board 2.

In the case in which the inner wall surfaces 5*a*1, 5*a*2 of the groove 5*a* are coated with the shield film 6, the groove 5*a* preferably has a tapered sectional shape that widens away from the upper surface 2*a* of the wiring board 2. With this configuration, when the shield film 6 is formed, in addition to the surface of the sealing resin layer 4 (the upper surface 4*a*, the side surface 4*c*), the inner wall surfaces 5*a*1, 5*a*2 of the groove 5*a*, and the region exposed from the bottom of the groove 5*a* can be coated with the shield film 6. In order to shape the groove 5*a* as above, the sacrificial layer 12 is formed such that the sectional area in the direction parallel to the upper surface 2*a* of the wiring board 2 becomes larger as the sacrificial layer 12 separates from the upper surface 2*a* of the wiring board 2.

Figure 4D:
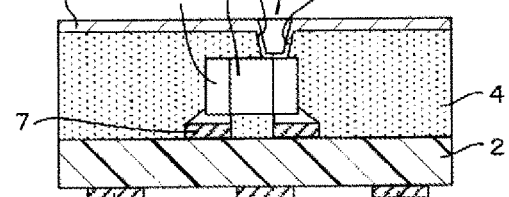

Further, as shown in FIG. 4D, in the case in which, among the upper surface of the component 3*b*, the portion coated with the side surface electrode 3*b*1 and the portion not coated therewith are both partially exposed from the bottom of the groove 5*a* as with the case of FIG. 4B, the inner wall surfaces 5*a*1, 5*a*2 of the groove 5*a* and the region of the component 3*b* exposed from the bottom of the groove 5*a* may be coated with the shield film 6. Also in this case, because the side surface electrode 3*b*1 of the component 3*b* is electrically connected to the shield film 6, the side surface electrode 3*b*1 exposed from the bottom of the groove 5*a* is the ground electrode of the component 3*b*. Further, because the shield film 6 can be grounded from the side surface electrode 3*b*1 of the component 3*b*, the shield film 6 is not necessarily connected to the internal wiring electrode 10 (the ground electrode) exposed from the side surface 2*c* of the wiring board 2.

In the case in which the inner wall surfaces 5*a*1, 5*a*2 of the groove 5*a* are coated with the shield film 6, the groove 5*a* preferably has a tapered sectional shape that widens away from the upper surface 2*a* of the wiring board 2. In order to shape the groove 5*a* as above, the sacrificial layer 12 is formed so that the sectional area in the direction parallel to the upper surface 2*a* of the wiring board 2 becomes larger as the sacrificial layer 12 separates from the upper surface 2*a* of the wiring board 2.

Figure 4E:
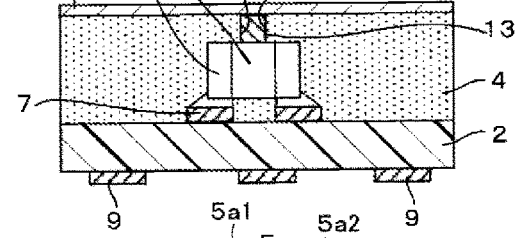

Further, as shown in FIG. 4E, in the case in which, among the upper surface of the component 3*b*, the region between the side surface electrodes 3*b*1 formed on both ends is exposed from the bottom of the groove 5*a*, the groove 5*a* may be filled with the conductive member 13 made of the conductive paste (such as the Cu paste or the Ag paste), and the conductive member 13 may be connected to the shield film 6. In this case, because the shield film 6 is connected to the ground electrode (the internal wiring electrode 10) of the wiring board 2, the conductive member 13 connected to the shield film 6 is also grounded.

Figure 4F:
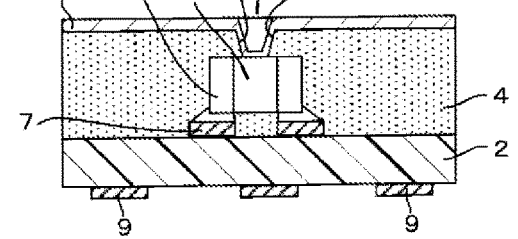

Further, as shown in FIG. 4F, in the case in which, among the upper surface of the component 3*b*, the region between the side surface electrodes 3*b*1 formed on both ends is exposed from the bottom of the groove 5*a*, the inner wall surfaces 5*a*1, 5*a*2 of the groove 5*a*, and the portion of the component 3*b* exposed from the bottom of the groove 5*a* may be coated with the shield film 6. In this way, in the case of coating the inner wall surfaces 5*a*1, 5*a*2 of the groove 5*a* with the shield film 6, the groove 5*a* preferably has the tapered sectional shape that widens away from the upper surface 2*a* of the wiring board 2. In order to shape the groove 5*a* as above, the sacrificial layer 12 is formed so that the sectional area in the direction parallel to the upper surface 2*a* of the wiring board 2 becomes larger as the sacrificial layer 12 separates from the upper surface 2*a* of the wiring board 2.

In addition, as shown in FIG. 4A, FIG. 4B, and FIG. 4E, in the configurations in which the groove 5*a* is filled with the conductive paste, the shield film 6 can also be formed of the conductive paste. In these configurations, filling the groove 5*a* with the conductive paste and forming the shield film 6 can be performed at the same time. Further, in these configurations, the high frequency module 1*a* can also be manufactured by forming the sacrificial layer 12 with the conductive paste in advance and then forming the shield film 6 without removing the sacrificial layer 12 later.

Figure 5A:
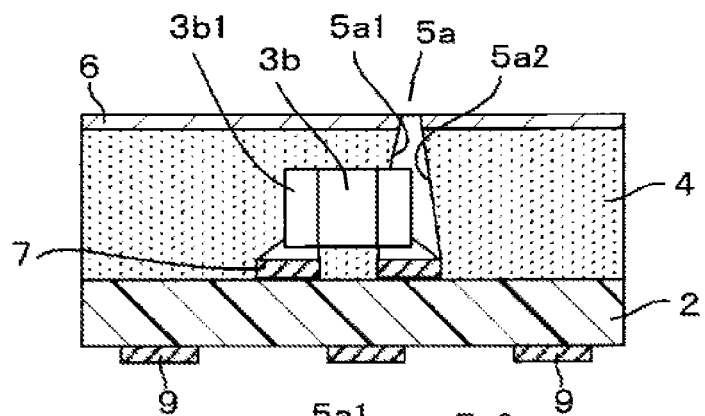
FIGS. 5A to 5D are views showing another modification of the shield structure of FIG. 1.

Further, as shown in FIG. 5A, in the case in which the side surface electrode 3*b*1 of the component 3*b* and the mounting electrode 7 soldered to the side surface electrode 3*b*1 (the connection portion between the side surface electrode 3*b*1 and the mounting electrode 7) are partially exposed from the bottom of the groove 5*a*, the sectional shape of the groove 5*a* is formed in a tapered shape that widens toward the upper surface 2*a* of the wiring board 2. The inner wall surfaces 5*a*1, 5*a*2 of the groove 5*a*, and the portion of the component 3*b* exposed from the bottom of the groove 5*a* may not be coated with the shield film 6.

In the case in which each of the two inner wall surfaces 5*a*1, 5*a*2 of the groove 5*a* facing each other is inclined such that the lower end edge is positioned further in a direction opposite to an inward direction of the groove 5*a* than an upper end edge, when viewed from the direction perpendicular to the upper surface 2*a* of the wiring board 2, that is, in the case in which the inner wall surfaces 5*a*1, 5*a*2 of the groove 5*a* are inclined so as not to be visible from the opening of the groove 5*a*, when viewed from the direction perpendicular to the upper surface 2*a* of the wiring board 2, the inner wall surfaces 5*a*1, 5*a*2 are not easily coated with the shield film 6. Therefore, in the case in which both inner wall surfaces 5*a*1, 5*a*2 of the groove 5*a* are not coated with the shield film 6, the sectional shape of the groove 5*a* may be formed in the tapered shape that widens toward the upper surface 2*a* of the wiring board 2. Additionally, in order to shape the groove 5*a* as above, the sacrificial layer 12 is formed such that the sectional area in the direction parallel to the upper surface 2*a* of the wiring board 2 becomes smaller as the sacrificial layer 12 separates from the upper surface 2*a* of the wiring board 2.

Figure 5B:
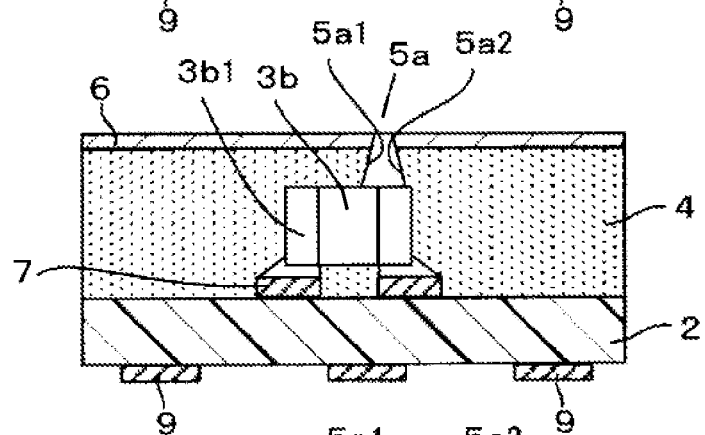

Further, as shown in FIG. 5B, in the case in which, among the upper surface of the component 3*b*, the portion coated with the side surface electrode 3*b*1 and the portion not coated therewith are both partially exposed from the bottom of the groove 5a, the sectional shape of the groove 5a is formed in the tapered shape that widens toward the upper surface 2a of the wiring board 2. The inner wall surfaces 5a1, 5a2 of the groove 5a, and the portion of the component 3b exposed from the bottom of the groove 5a may not be coated with the shield film 6.

Figure 5C:
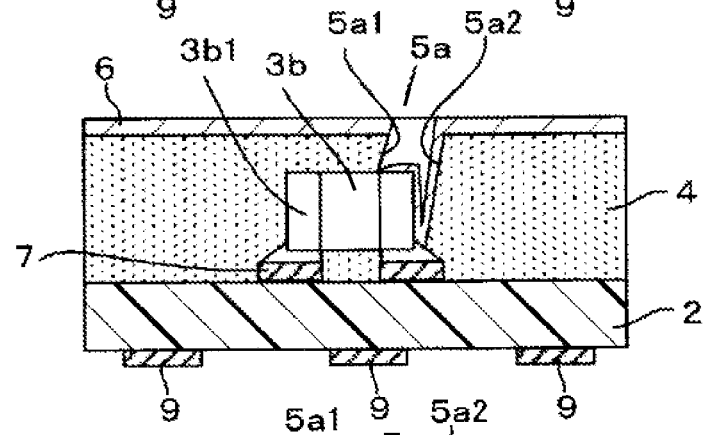

Further, as shown in FIG. 5C, in the case in which the side surface electrode 3b1 of the component 3b and the mounting electrode 7 soldered to the side surface electrode 3b1 are partially exposed from the bottom of the groove 5a, one of the two inner wall surfaces 5a1, 5a2 of the groove 5a facing each other (the inner wall surface 5a1) is inclined such that the lower end edge is positioned further in the direction opposite to the inward direction of the groove 5a than the upper end edge, and the other (the inner wall surface 5a2) is inclined such that the lower end edge is positioned further in the inward direction of the groove 5a than the upper end edge. Then, the other inner wall surface 5a2 of the groove 5a, and the portion exposed from the bottom of the groove 5a of the component 3b may be coated with the shield film 6, but the one inner wall surface 5a1 may not be coated with the shield film 6. In this way, in the case in which one of the two inner wall surfaces 5a1, 5a2 facing each other is not coated with the shield film 6 and the other is coated with the shield film 6, when viewed from the direction perpendicular to the upper surface 2a of the wiring board 2, the one inner wall surface 5a1 is inclined so as not to be visible from the opening of the groove 5a, and the other inner wall surface 5a2 is inclined so as to be visible from the opening of the groove.

In this case, because the side surface electrode 3b1 of the component 3b is electrically connected to the shield film 6, the side surface electrode 3b1 exposed from the bottom of the groove 5a is the ground electrode of the component 3b. Further, because the shield film 6 can be grounded from the side surface electrode 3b1 of the component 3b, the shield film 6 is not necessarily connected to the internal wiring electrode 10 (the ground electrode) exposed from the side surface 2c of the wiring board 2. Further, because the one inner wall surface 5a1 is not coated with the shield film 6, in the shield film 6, the portion that coats the inner region of the groove 5a and the portion that coats the outer region of the groove 5a can be electrically separated from each other. Therefore, the shield characteristics of the groove 5a are improved. Note that the above sectional shape of the groove 5a can be realized by controlling the shape of the sacrificial layer 12.

Figure 5D:
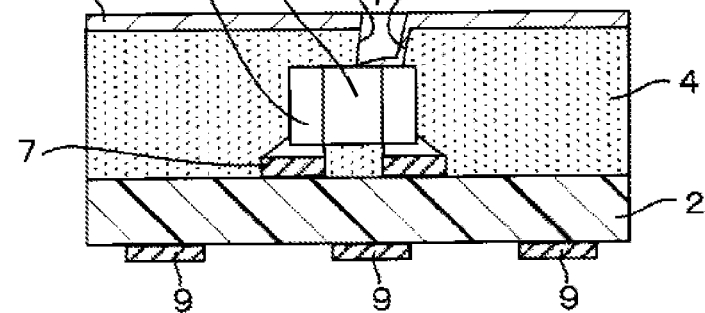

Further, as shown in FIG. 5D, in the case in which, among the upper surface of the component 3b, the portion coated with the side surface electrode 3b1 and the portion not coated therewith are both partially exposed from the bottom of the groove 5a, one (the inner wall surface 5a1) of the two inner wall surfaces 5a1, 5a2 of the groove 5a facing each other is inclined such that the lower end edge is positioned further on the direction opposite to the inward direction of the groove 5a than the upper end edge, and the other (the inner wall surface 5a2) is inclined such that the lower end edge is positioned further in the inward direction of the groove 5a than the upper end edge. Then, the other inner wall surface 5a2 of the groove 5a and the portion exposed from the bottom of the groove 5a of the component 5 may be coated with the shield film 6, but the one inner wall surface 5a1 may not be coated with the shield film 6.

In this case, because the side surface electrode 3b1 of the component 3b is electrically connected to the shield film 6, the side surface electrode 3b1 exposed from the bottom of the groove 5a is the ground electrode of the component 3b. Further, because the shield film 6 can be grounded from the side surface electrode 3b1 of the component 3b, the shield film 6 is not necessarily connected to the internal wiring electrode 10 (the ground electrode) exposed from the side surface 2c of the wiring board 2. Further, because the one inner wall surface 5a1 is not coated with the shield film 6, in the shield film 6, the portion that coats the inner region of the groove 5a can be electrically separated from the portion that coats the outer region of the groove 5a. Therefore, the shield characteristics of the groove 5a are improved.

Second Embodiment

A high frequency module 1b according to a second embodiment of the present disclosure is described with reference to FIG. 6. Note that FIG. 6 is a plan view of the high frequency module 1b with a shield film 6 removed, and corresponds to FIG. 1.

Figure 6:
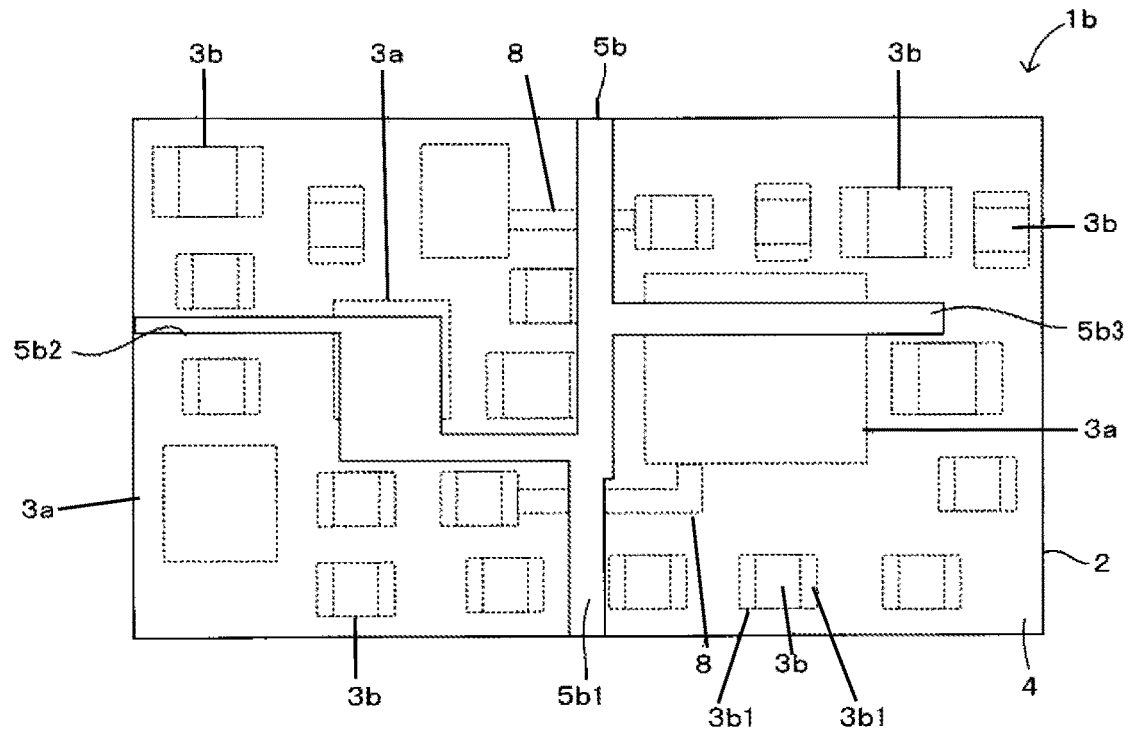
FIG. 6 is a plan view of a high frequency module according to a second embodiment of the present disclosure with a shield film removed.

The high frequency module 1b according to this embodiment is different from the high frequency module 1a of the first embodiment described with reference to FIGS. 1, 2A and 2B in, as shown in FIG. 6, the configuration of the shield groove. Other configurations are the same as those of the high frequency module 1a according to the first embodiment, and therefore, the same reference numerals are given and the descriptions thereof are omitted.

In this case, a groove 5b is formed so as to divide a sealing resin layer 4 into a plurality of regions (see FIG. 6). Specifically, when viewed from the direction perpendicular to an upper surface 2a of a wiring board 2, the groove 5b is constituted of a substantially linear first groove 5b1 whose one end reaches one long side of the horizontally long rectangular sealing resin layer 4 and the other end reaches the other long side facing the one long side, a second groove 5b2 branching from the middle of the first groove 5b1, bent midway, and reaches one short side of the sealing resin layer 4 at an end thereof, and a linear third groove 5b3 branching from the middle of the first groove 5b1 and extending toward the other short side facing the one short side. Further, the width of the groove 5b is arbitrarily changed depending on the formation location.

The high frequency module 1b of this embodiment is also formed by the same method as that of the first embodiment. That is, according to the manufacturing method of the high frequency module 1a of the first embodiment described above, by arbitrarily changing the shape of a sacrificial layer 12, the shape of the groove 5b (groove width, formation location, etc.) can be arbitrarily changed. Further, because laser processing or cutting with a dicing machine is not used for forming the groove 5b, components 3a and 3b are not damaged regardless of the shape of the groove 5b. Therefore, as with the first embodiment, downsizing can be achieved by reducing the height of the high frequency module 1b, and can be downsized by reducing the size of the main surface of the wiring board 2. Further, because laser processing or cutting with a dicing machine is not performed to form the groove 5b, the wiring board 2 and internal wiring electrodes 10 are not damaged, and the reliability of the high frequency module 1b is improved. In this embodiment, the groove width may be constant when viewed from the direction perpendicular to the upper surface 2a of the wiring board 2.

Third Embodiment

A high frequency module 1c according to a third embodiment of the present disclosure is described with reference to FIG. 7. Note that FIG. 7 is a sectional view of the high frequency module 1c and corresponds to FIG. 2A.

Figure 7:
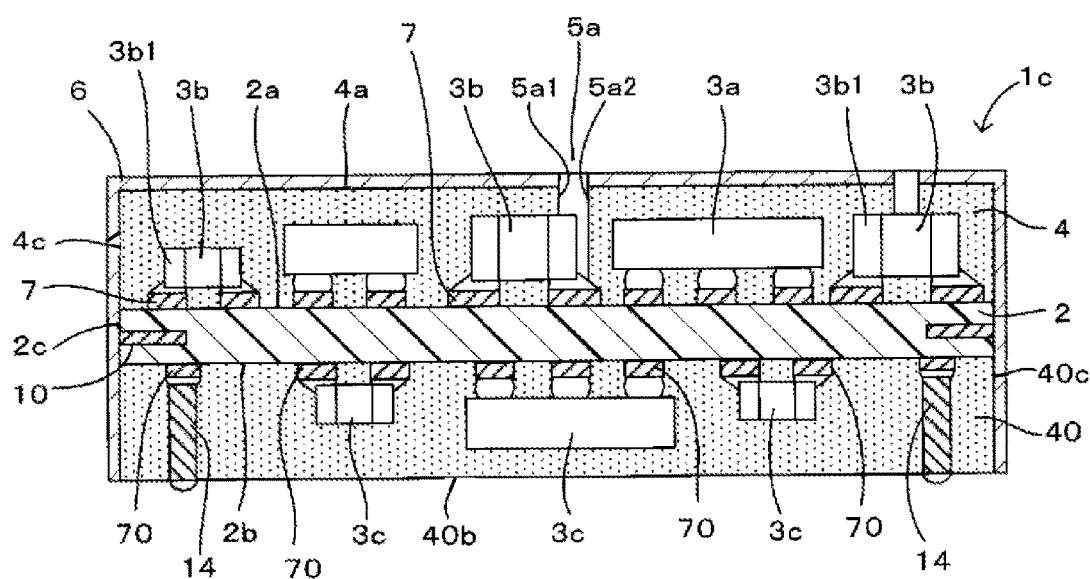
FIG. 7 is a sectional view of a high frequency module according to a third embodiment of the present disclosure.

The high frequency module 1c of this embodiment is different from the high frequency module 1a of the first embodiment described with reference to FIGS. 1, 2A and 2B in the configuration on the side of a lower surface 2b of a wiring board 2 as shown in FIG. 7. Other configurations are the same as those of the high frequency module 1a according to the first embodiment, and therefore, the same reference numerals are given and the descriptions thereof are omitted.

In this case, a plurality of mounting electrodes 70 are formed on the lower surface 2b of the wiring board 2 instead of the external electrodes 9 of the first embodiment. Further, components 3c and external terminals 14 are each mounted on the mounting electrode 70, and are sealed by a second sealing resin layer 40. The lower end of the external terminal 14 is exposed from a lower surface 40b of the second sealing resin layer 40 and functions as a terminal for external connection. A shield film 6 coats a side surface 40c of the second sealing resin layer 40 in addition to an upper surface 4a and a side surface 4c of a sealing resin layer 4 and a side surface 2c of the wiring board 2. The external terminal 14 can be formed of a via conductor, a post electrode formed by plating, a metal pin, or others.

According to this configuration, in addition to the effect of the high frequency module 1a of the first embodiment, high density mounting of the components becomes possible.

The present disclosure is not limited to the above-described embodiments, and various modifications other than those described above can be made without departing from the spirit of the disclosure. For example, the configurations of the above-described embodiments and modifications may be combined.

Further, the shape of the grooves 5a, 5b may be a stepwise groove in which the groove width changes at an intermediate position in the depth direction, or the inner wall surfaces 5a1, 5a2 of the groove 5a may be formed in a curved shape.

Further, a metal block made of Cu or the like may be mounted on the upper surface 2a of the wiring board 2, and a groove may be formed at a position overlapping with the metal block. In this case, for example, as shown in FIGS. 4A and 4B, a conductive member may be arranged by filling the groove with a conductive paste and connected to the shield film.

Further, in the above-described embodiment, the case has been described in which the coating insulating layer 11 that coats the components 3b and the surface layer wiring electrode 8 is partially exposed from the bottom of the grooves 5a, 5b, but the coating insulating layer 11 may not necessarily be exposed.

Further, the present disclosure can be applied to various high frequency modules in each of which a groove for shielding is formed in a sealing resin layer that seals components, and to a manufacturing method of the same.

1a to 1c: High frequency module
2: Wiring board
3a to 3c: Components
4: Sealing resin layer
5a, 5b: Groove
6: Shield film
8: Surface layer wiring electrode (wiring electrode)
11: Coating insulating layer
12: Sacrificial layer

The invention claimed is:

1. A manufacturing method of a high frequency module including a sealing resin layer, the method comprising:
    a mounting step of mounting a component on a main surface of a wiring board;
    a sacrificial layer forming step of forming the sacrificial layer on the main surface of the wiring board, wherein the sacrificial layer is for forming a groove on the sealing resin layer;
    a sealing resin layer forming step of forming the sealing resin layer sealing the sacrificial layer together with the component;
    a removal step of removing the sacrificial layer; and
    a shield film forming step of forming the shield film coating a surface of the sealing resin layer,
    wherein the sacrificial layer is formed of a resin different from a resin of the sealing resin layer, and
    wherein, in the removal step, the groove is formed by dissolving and removing the resin of the sacrificial layer.

2. The manufacturing method of the high frequency module according to claim 1,
    wherein, in the sacrificial layer forming step, the groove is formed on a signal wiring electrode by forming the sacrificial layer, wherein the sacrificial layer at least partially overlaps with the signal wiring electrode formed on the main surface of the wiring board when viewed from a direction perpendicular to the main surface of the wiring board.

3. The manufacturing method of the high frequency module according to claim 2, further comprising, before the sacrificial layer forming step, a step of forming a coating insulating layer coating at least the signal wiring electrode.

4. The manufacturing method of the high frequency module according to claim 1,
    wherein, in the sacrificial layer forming step, the groove is formed on the component by forming the sacrificial layer, wherein the sacrificial layer at least partially overlaps with the component when viewed from a direction perpendicular to the main surface of the wiring board.

5. The manufacturing method of the high frequency module according to claim 1,
    wherein, in the sacrificial layer forming step, the sacrificial layer is formed, wherein a sectional area of the sacrificial layer in a direction parallel to the main surface of the wiring board increases as the sacrificial layer separates from the main surface of the wiring board.

6. The manufacturing method of the high frequency module according claim 1,
    wherein, in the sacrificial layer forming step, the sacrificial layer is formed, wherein a sectional area of the sacrificial layer in a direction parallel to the main surface of the wiring board becomes smaller as the sacrificial layer separates from the main surface of the wiring board.

7. The manufacturing method of the high frequency module according to claim 2,
    wherein, in the sacrificial layer forming step, the groove is formed on the component by forming the sacrificial layer, wherein the sacrificial layer at least partially overlaps with the component when viewed from the direction perpendicular to the main surface of the wiring board.

8. The manufacturing method of the high frequency module according to claim 2,
wherein, in the sacrificial layer forming step, the sacrificial layer is formed, wherein a sectional area of the sacrificial layer in a direction parallel to the main surface of the wiring board increases as the sacrificial layer separates from the main surface of the wiring board.

9. The manufacturing method of the high frequency module according claim 2,
wherein, in the sacrificial layer forming step, the sacrificial layer is formed, wherein a sectional area of the sacrificial layer in the direction parallel to the main surface of the wiring board becomes smaller as the sacrificial layer separates from the main surface of the wiring board.

10. The manufacturing method of the high frequency module according to claim 3,
wherein, in the sacrificial layer forming step, the groove is formed on the component by forming the sacrificial layer, wherein the sacrificial layer at least partially overlaps with the component when viewed from the direction perpendicular to the main surface of the wiring board.

11. The manufacturing method of the high frequency module according to claim 3,
wherein, in the sacrificial layer forming step, the sacrificial layer is formed, wherein a sectional area of the sacrificial layer in a direction parallel to the main surface of the wiring board increases as the sacrificial layer separates from the main surface of the wiring board.

12. The manufacturing method of the high frequency module according claim 3,
wherein, in the sacrificial layer forming step, the sacrificial layer is formed, wherein a sectional area of the sacrificial layer in the direction parallel to the main surface of the wiring board becomes smaller as the sacrificial layer separates from the main surface of the wiring board.

13. The manufacturing method of the high frequency module according to claim 4,
wherein, in the sacrificial layer forming step, the sacrificial layer is formed, wherein a sectional area of the sacrificial layer in a direction parallel to the main surface of the wiring board increases as the sacrificial layer separates from the main surface of the wiring board.

14. The manufacturing method of the high frequency module according claim 4,
wherein, in the sacrificial layer forming step, the sacrificial layer is formed, wherein a sectional area of the sacrificial layer in the direction parallel to the main surface of the wiring board becomes smaller as the sacrificial layer separates from the main surface of the wiring board.

15. A high frequency module comprising:
a wiring board having one main surface and the other main surface opposite to the one main surface;
a component provided on a one main surface of the wiring board;
a sealing resin layer sealing the component;
a groove provided in the sealing resin layer; and
a shield film coating at least a surface of the sealing resin layer,
wherein the groove at least partially overlaps the component when viewed from a direction perpendicular to the one main surface of the wiring board, and the component is partially exposed from a bottom of the groove at the overlapping position.

16. The high frequency module according to claim 15,
wherein the component has a ground electrode provided at a portion exposed from the bottom of the groove, and the shield film is electrically connected to the ground electrode.

17. The high frequency module according to claim 15,
wherein the groove has a one inner wall surface and another inner wall surface facing the one inner wall surface, and
wherein at least the one inner wall surface is inclined, wherein a lower end edge is positioned further in a direction opposite to an inward direction of the groove than an upper end edge, when viewed from the direction perpendicular to the one main surface of the wiring board, and
wherein the one inner wall surface is not coated with the shield film.

18. A high frequency module comprising:
a wiring board;
a component provided on a one main surface of the wiring board;
a sealing resin layer sealing the component;
a groove provided in the sealing resin layer; and
a shield film coating at least a surface of the sealing resin layer,
wherein the groove is provided to divide the sealing resin layer into a plurality of regions when viewed from a direction perpendicular to the one main surface of the wiring board, and provided to partially overlap with a signal wiring electrode provided on the one main surface of the wiring board,
wherein the signal wiring electrode being is coated with a coating insulating layer, and the coating insulating layer is exposed from a bottom of the groove at a position in which the signal wiring electrode overlaps with the groove, and
wherein the groove has a wall surface not coated with the shield film.

19. The high frequency module according to claim 15,
wherein the wiring board has another component different from the component mounted on the other main surface.

20. The high frequency module according to claim 16,
wherein the groove has a one inner wall surface and another inner wall surface facing the one inner wall surface, and
wherein at least the one inner wall surface is inclined, wherein a lower end edge is positioned further in a direction opposite to an inward direction of the groove than an upper end edge, when viewed from the direction perpendicular to the one main surface of the wiring board, and
wherein the one inner wall surface is not coated with the shield film.

* * * * *